United States Patent
Hirayama et al.

(10) Patent No.: US 6,693,353 B1
(45) Date of Patent: Feb. 17, 2004

(54) SEMICONDUCTOR PACKAGE AND METHOD FOR PRODUCING HEAT-RADIATING SUBSTRATE FOR IT

(75) Inventors: Norio Hirayama, Yamagata (JP); Mitsuo Osada, Yamagata (JP); Akira Ichida, Toyama (JP); Yoshinari Amano, Yamagata (JP); Kiyoshi Asai, Toyama (JP); Hidetoshi Maesato, Yamagata (JP); Tadashi Arikawa, Toyama (JP); Kenji Sakimae, Yamagata (JP)

(73) Assignee: Tokyo Tungsten Co., Ltd., Tokyo (JP)

( * ) Notice: Subject to any disclaimer, the term of this patent is extended or adjusted under 35 U.S.C. 154(b) by 0 days.

(21) Appl. No.: 09/252,880

(22) Filed: Feb. 18, 1999

(51) Int. Cl.[7] .......................... H01L 23/48; H01L 23/52
(52) U.S. Cl. ...................... 257/746; 257/762; 257/763; 438/610; 438/648
(58) Field of Search ................................ 257/746–763; 419/19; 428/567; 438/582, 610, 648, 683, 785

(56) References Cited

U.S. PATENT DOCUMENTS

| | | | | |
|---|---|---|---|---|
| 4,158,719 A | * | 6/1979 | Frantz | 428/567 |
| 4,680,618 A | * | 7/1987 | Kuroda et al. | 357/74 |
| 5,481,136 A | * | 1/1996 | Kohmoto et al. | 257/712 |
| 5,493,153 A | * | 2/1996 | Arikawa et al. | 257/796 |
| 5,563,101 A | * | 10/1996 | Osada et al. | 437/209 |
| 6,395,582 B1 | * | 5/2002 | Sohn et al. | 438/111 |

FOREIGN PATENT DOCUMENTS

| | | |
|---|---|---|
| JP | 7249717 | 9/1995 |
| JP | 10273745 | 10/1998 |

* cited by examiner

*Primary Examiner*—Matthew Smith
*Assistant Examiner*—Calvin Lee

(57) ABSTRACT

A package to be mounted with semiconductor chips has a heat-radiating substrate having a thickness of smaller than 0.4 mm of a Cu—Mo composite as prepared by impregnating from 30 to 40% by mass of copper (Cu) melt into a green compact of molybdenum. The heat-radiating substrate is produced by preparing an Mo green compact through isostatic molding, mounting Cu on the Mo green compact, heating it to thereby impregnate copper into the Mo green compact to give a Cu—Mo composite, and rolling the Cu—Mo composite into a sheet substrate. In the isostatic molding process, at least two or more plates. 27, 29, 31, 33, 35 and 37 are disposed adjacent to the inner surface of a side wall as divided into at least two portions, Mo powder is filled into the space as formed by those plates 27, 29, 31, 33, 35 and 37 with covering the Mo powder compact with a flexible cover, such as a rubber medium 39 or the like, to prepare a composite, then the resulting composite is put into a pressure tank, an external isostatic pressure is applied thereto against the flexible cover, and the plates are slid via the cover along the side wall thereby compressing the composite between the thus-slid plates into an Mo green compact.

6 Claims, 5 Drawing Sheets

SEMICONDUCTOR PACKAGE AND METHOD FOR PRODUCING HEAT-RADIATING SUBSTRATE FOR IT

BACKGROUND OF THE INVENTION

1. Field of the Invention

The present invention relates to an isostatic molding method for ceramic powders, metal powders and their composites, more precisely, to a semiconductor package for which is used high-melting-point metal powders of W, Mo and the like, composites such as Cu/W, Cu/Mo, W/Ni/Cu, W/Ni/Fe and the like, or composites such as Mo/TiC, Al/SiC and the like, and also to an isostatic molding method for producing heat-radiating substrates for semiconductor packages.

2. Description of the Related Art

Heat radiation from packages of semiconductor devices that are used in communication-related appliances such as portable telephones and others is the recent important theme in the art. Heat-radiating members on which those semiconductor devices for microwaves are to be mounted are being in demand. For the heat-radiating members, metallic materials of aluminum, copper and the like may be taken into consideration in view of their heat conductivity. However, as greatly expanding with heat, members of such metallic materials are often problematic in that, when bonded to semiconductor chips of silicon and the like or to insulating members such as aluminum nitride substrates and the like mounted with silicon, they may be deformed or cracked due to the heat change in solder bonding or repeated use and due to the difference in thermal expansion between the metallic members and the semiconductor or insulating members. Therefore, materials with good heat conductivity, of which the thermal expansion approaches to that of semiconductors and insulating ceramic materials, are desired.

Aluminum nitride to be mounted with semiconductor chips is generally lined with a Cu sheet on its back surface.

As heat-radiating substrates meeting the requirements noted above, composite materials of tungsten (w)-copper (Cu) (hereinafter referred to as W—Cu composites) have been proposed.

To produce such W—Cu composites, employed is a method which is as follows: W powder is molded under compression to give a green compact. The green compact is then sintered in a reducing atmosphere into a porous body of W having a predetermined degree of porosity. Next, copper is infiltrated into the porous body in a reducing atmosphere at a temperature not lower than the melting point of copper to obtain a W—Cu composite.

In order to evade the problem of thermal strain noted above, heat-radiating substrates for IC (integrated circuit) packages, for which are used ceramic materials, must be so designed that their thermal expansion approaches to that of alumina, beryllia and the like. For these, used are W—Cu composites with from 10 to 15% by mass of copper infiltrated thereinto.

Those W—Cu composites well used for heat-radiating substrates are produced by infiltrating Cu into porous bodies of W. In general, they essentially have a Cu content of from 10 to 20% by mass, and have good characteristics. For example, they have a thermal expansion coefficient of from 7 to $8 \times 10^{-6}$/K, and a thermal conductivity of from 180 to 200 W/m·K. However, in the recent tendency toward lightweight, thin and small parts in the art, the disadvantages of high density and heavy weight of W—Cu composites are being serious problems. In addition, since W—Cu composites are worked by cutting into products, their another drawback is that they could not be thinned well.

Specific methods for producing Mo—Cu green compacts are mentioned below.

One method is known for producing green compacts of ordinary ceramics, metal powders and their composites through isostatic molding, which comprises putting a powder to be molded, for example a powder of Mo or the like, into a rubber bag mold or the like, sealing the mold, then putting it into a hydraulic pressure tank filled with water, and applying an external hydraulic press to the rubber mold so as to press the powder into a green compact.

Also known is another method for producing such green compact through ordinary powder pressing, for which is used a pressing device. The pressing device comprises a mortar to give the inner wall surface for the cavity, and upper and lower rods to give the upper and lower surfaces for the cavity. Concretely, a powder of Mo or the like is filled into the cavity to be formed by the mortar and the rods, sealed with the upper rod, and then compressed by the upper and lower rods into a green compact.

Using conventional Cu—Mo composites for producing heat-radiating substrates for semiconductor packages for microwaves is problematic in various aspects of, for example, the characteristics of the composites, the workability thereof, and even the thickness of the products to be produced from them.

For producing heat-radiating substrates such as those noted above, intermediate products of green compacts for them are prepared. In conventional isostatic molding methods, green compacts having been pressed with a uniform pressure could be obtained. In those, however, since flexible rubber molds or the like are used, well-shaped plates or green compacts having a specific shape are difficult to obtain.

On the other hand, in powder pressing methods for producing large-sized green compacts by applying pressure to powder from the upper and lower sides, large pressure is applied to powder. Therefore, for the methods, the mold, especially the mortar to be used must be so designed that its mechanical strength is satisfactorily high. For these reasons, the methods are defective in that the costs for the mold are high.

SUMMARY OF THE INVENTION

One object of the invention is to provide a semiconductor package for microwaves or power, for which is used a thin, heat-radiating substrate having good characteristics and workability.

Another object is to provide an isostatic molding method for producing inexpensive and well-shaped green compacts.

Still another object is to provide a method for producing heat-radiating substrates for microwave or power semiconductor packages, in which is used the isostatic molding method noted above.

According to one aspect of the invention, obtained is a semiconductor package to be mounted with semiconductor chips, which is characterized in that it has a heat-radiating substrate having a thickness of smaller than 0.4 mm of a Cu—Mo composite as prepared by impregnating from 30 to 40% by mass of copper (Cu) melt into a green compact of molybdenum.

Preferably, in the invention, the heat-radiating substrate is a high-reliability heat-radiating substrate characterized by having a thermal expansion coefficient of from 7.7 to 9.0×10$^{-6}$/K, a thermal conductivity of from 200 to 220 W/m·K, a Young's modulus of from 220 to 230 GPa, and a density of not larger than 9.8 g/cm$^3$. Also preferably, the semiconductor chips are microwave semiconductor chips.

According to another aspect of the invention, obtained is a power semiconductor package with semiconductor chips being mounted on a composite substrate of aluminum nitride as sandwiched between heat-radiating substrates of high heat conductivity metal plates, which is characterized in that at least one of said heat-radiating substrates is of substantially a Cu—Mo composite as prepared by impregnating copper melt into a green compact of Mo powder having been previously mixed with at most 5% by mass of Cu, in such a manner that the total Cu content of the thus-impregnated green compact may fall between 40 and 60% by mass.

According to still another aspect of the invention, there is provided an isostatic molding method for producing green compacts, which comprises disposing at least two plates adjacent to the inner surface of a side wall as divided into at least two portions, putting a powder into the space between the plates with covering the powder compact with a flexible cover to prepare a composite, then putting the resulting composite into a pressure tank, applying an external isostatic pressure thereto against the flexible cover, and then sliding the plates via the cover along the side wall thereby compressing the composite between the thus-slid plates into a green compact.

In the invention, preferably, the composite is, in place of being put into the pressure tank, put into a pressure chamber in a dry-type isostatic molding device, and compressed therein into a green compact.

Also preferably, in the invention, at least two plates are so disposed that a pair of the plates face each other along the inner surface of the side wall as divided into at least two portions, and a powder is filled into the space between the plates to give a powder compact therebetween. In that condition, at least one partitioning plate is disposed between the pair of opposed plates, and a powder is filled into every space as formed by the opposed plates and the partitioning plate to give a plurality of green compacts all at a time.

Further preferably, in the invention, the powder is of Mo to give a green compact of Mo.

According to still another aspect of the invention, there is provided a method for producing heat-radiating substrates, which comprises disposing at least two plates adjacent to the inner surface of a side wall as divided into at least two portions, putting Mo powder into the space between the plates with covering the powder compact with a flexible cover to prepare a composite, then putting the resulting composite into a pressure tank, applying an external isostatic pressure thereto against the flexible cover, then sliding the plates via the cover along the side wall thereby compressing the composite between the thus-slid plates into an Mo green compact, mounting Cu on the Mo green compact, and then heating the Mo green compact with Cu mounted thereon so as to impregnate Cu into the Mo green compact to give a heat-radiating, Cu—Mo composite substrate.

In the invention, preferably, the Cu—Mo composite substrate is rolled into a heat-radiating substrate having a thickness of smaller than 0.4 mm.

DESCRIPTION OF THE PREFERRED EMBODIMENTS

Figure 1:
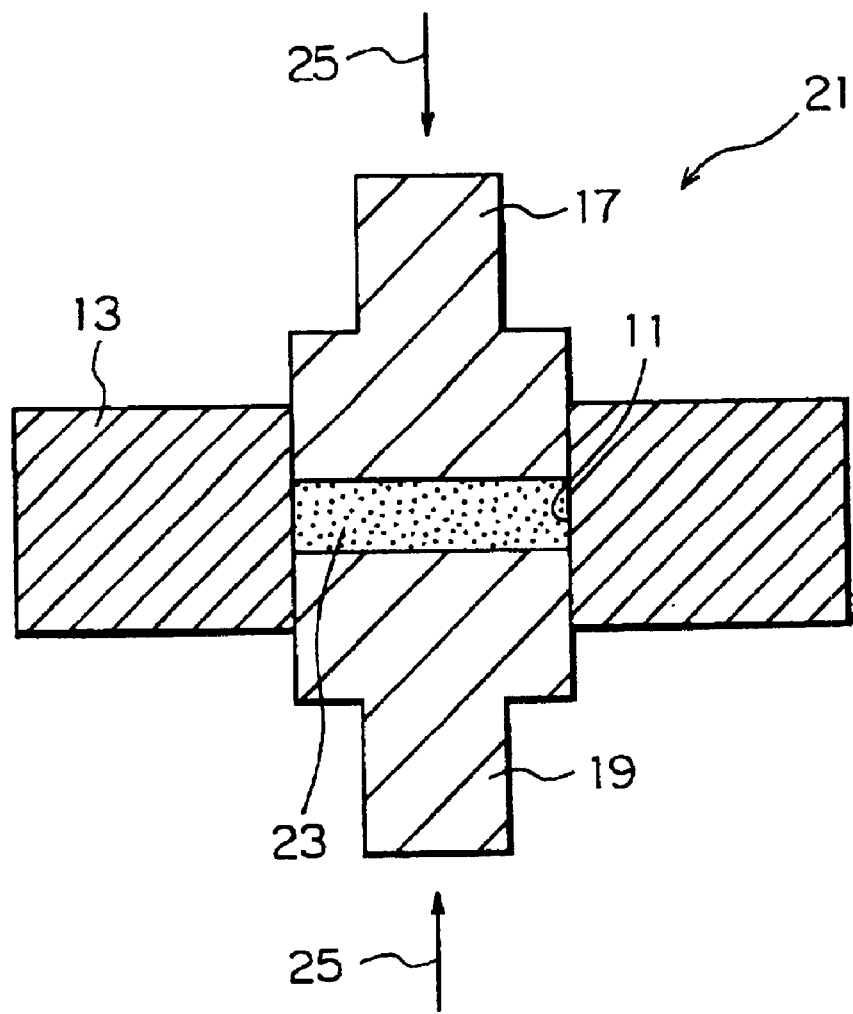
FIG. 1 is a cross-sectional view for explaining a conventional, powder pressing method.

Prior to describing the preferred embodiments of the no invention, a conventional, isostatic molding method is first described, with reference to FIG. 1, for facilitating good understanding of the invention.

As in FIG. 1, an ordinary powder pressing method is known. For this method, used is a pressing device 21 that comprises a mortar 13 to form the inner wall surface of the cavity 11, and upper and lower rods 17 and 19 to form the upper and lower surfaces of the cavity 11. Concretely, a powder 23 of Mo or the like is filled into the space as formed by the mortar 13 and the lower rod 19, then sealed with the upper rod 17, and thereafter compressed by the upper and lower rods 17 and 19 under pressure being applied thereto in the direction shown by the arrows 25 to give a green compact.

Then, the embodiments of the invention are described, with reference to FIGS. 2A, 2B and 2C to FIGS. 5A and 5B.

Figure 2A:
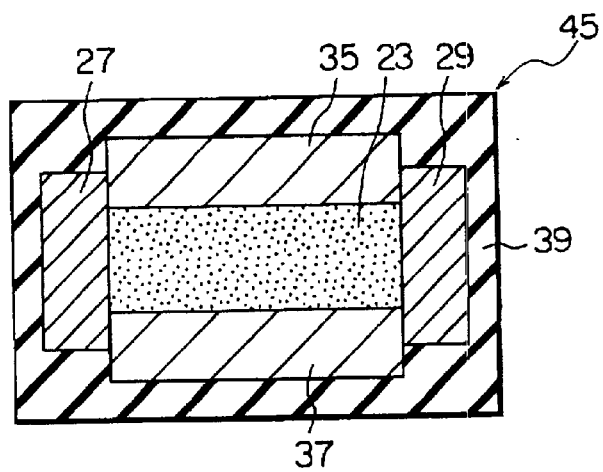
FIG. 2A is a horizontal cross-sectional view in outline for explaining the first embodiment of the invention of an isostatic molding method.
Figure 2B:
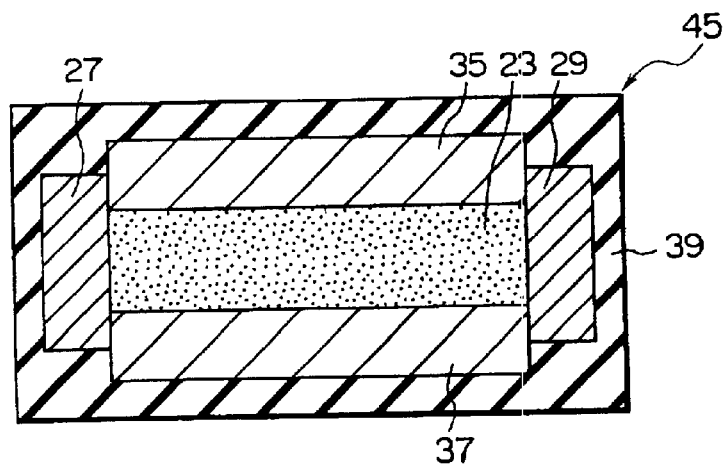
FIG. 2B is a vertical cross-sectional view in outline for explaining the first embodiment of the invention of an isostatic molding method.
Figure 2C:
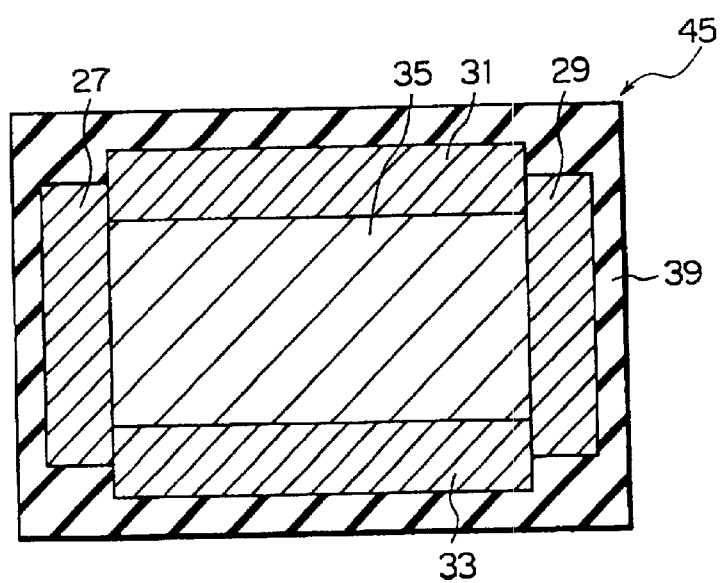
FIG. 2C is a cross-sectional top view in outline for explaining the first embodiment of the invention of an isostatic molding method.
Figure 3:
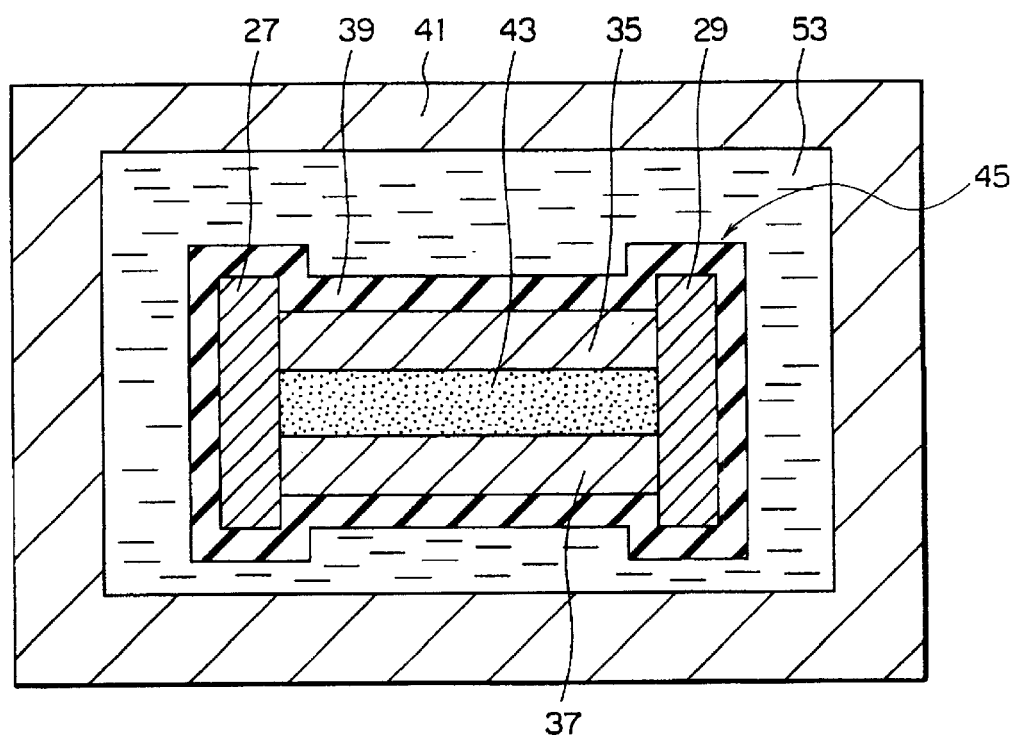
FIG. 3 is a cross-sectional view in outline for explaining a press molding method.

As in FIGS. 2A, 2B and 2C, a starting powder 23 of, for example, Mo or the like is filled into the cavity as surrounded by the first to fourth side plates 27, 29, 31, 33, the upper plate 35 and the lower plate 37, all of rigid plates of, for example, tool steel, high-speed steel, stainless steel or the like, and this is covered with a rubber medium 39. Next, as in FIG. 3, this is put into a pressure container 41 of a water tank, and compressed under an external hydraulic pressure of from 0.5 to 3.6 tons/cm$^2$ as applied thereto via the rubber medium 39, whereby the powder 23 is compressed into a green compact 43.

According to the method of the first embodiment of the invention, the green compact obtained may have a more controlled shape, as compared with that obtained according to an ordinary isostatic molding method that comprises putting a powder into a rubber bag mold, putting the mold with the powder therein into a water tank, applying a hydraulic pressure thereto so as to compress the powder into a green compact.

In the powder molding method of the first embodiment of the invention, the side plates that act as the mortar in the ordinary powder pressing method noted above are held by the hydraulic pressure via the rubber medium 39. Therefore, the method requires such simple-structured, rigid plates, but not any structure for holding the plates.

The composite to be compressed in the first embodiment of the invention, which is covered with the rubber medium, may be applied to a dry-type isostatic molding method of so-called dry CIP (dry cold isostatic pressing).

Figure 4A:
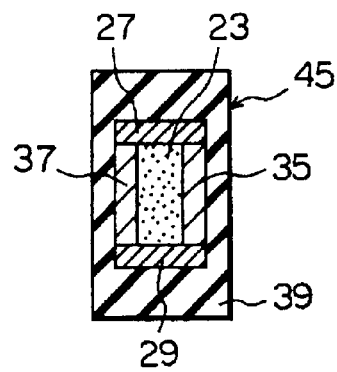
FIG. 4A is a cross-sectional view of a body to be compressed, which is for graphically explaining the second embodiment of the invention of an isostatic molding method.

As in FIG. 4A, a powder 23 of, for example, Mo or the like is filled into the cavity as surrounded by the first to fourth side plates 27, 29, 31, 33, the upper plate 35 and the lower plate 37, such as those in FIG. 2A to FIG. 2C, and this is covered with a rubber medium 51 to prepare a body 43 to be shape-controlled, separately from the molding device.

Figure 4B:
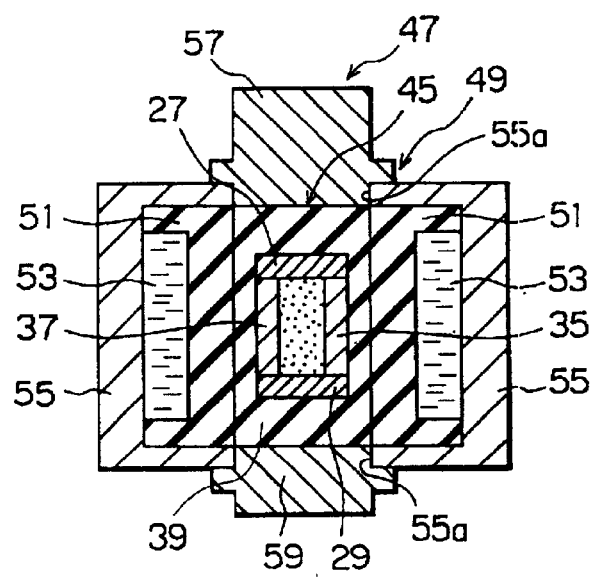
FIG. 4B is a cross-sectional view in outline of an isostatic molding device with no pressure applied thereto, which is for graphically explaining the second embodiment of the invention of an isostatic molding method.

Next, as in FIG. 4B, the body 43 to be compressed is set in the pressure chamber 47 in the isostatic molding device 45. In this, the pressure chamber 47 is provided with a pressure container 55 that houses therein rubber 51 and water 53 surrounding the rubber 51, and an upper ram 57 and a lower ram 59 that seal the openings 49, of the pressure container 55 formed at the upper and lower sides.

As in FIG. 4B, the body 43 to be compressed is set in the pressure chamber 47, and the hydraulic pressure in the isostatic molding device 45 is increased. As a result, as in FIG. 4C, the hydraulic pressure of the pressurized water 53' is applied to the body 43 as set in the pressure chamber 47, via the wall of the rubber 51, whereby the powder in the body 43 is compressed by the upper plate 35 and the lower plate 37 into a green compact 43. The hydraulic pressure in this case is nearly the same as that in the first embodiment mentioned above.

Figure 5A:
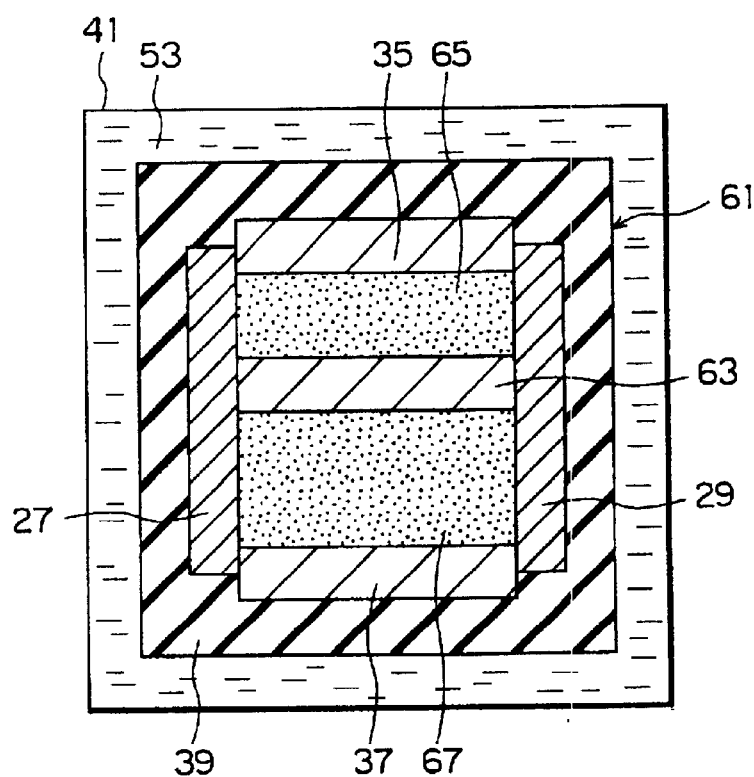
FIG. 5A is a cross-sectional view in outline for explaining the third embodiment of the invention of an isostatic molding method, in which no pressure is applied to the system.
Figure 5B:
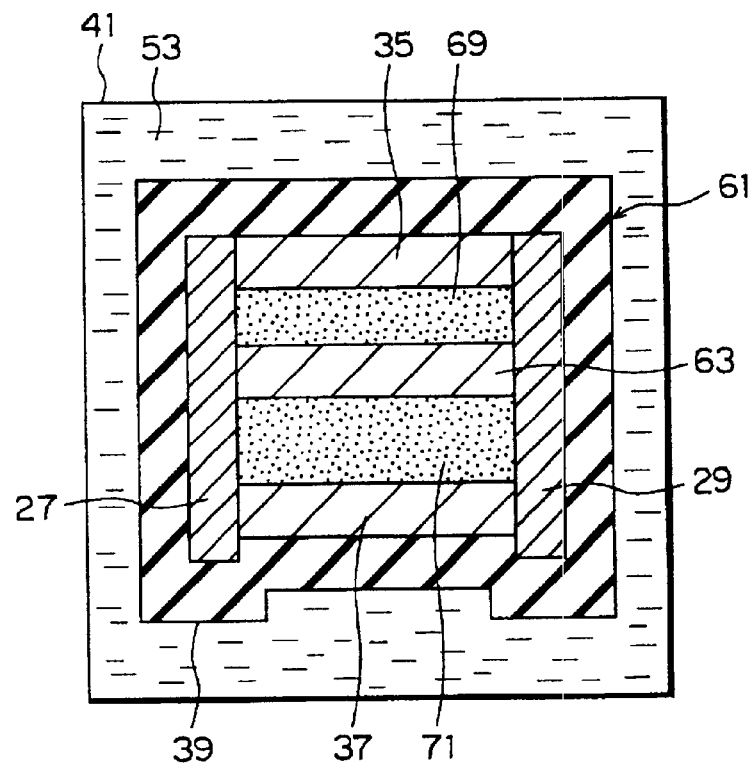
FIG. 5B is a cross-sectional view in outline for explaining the third embodiment of the invention of an isostatic molding method, in which pressure has been applied to the system.

FIG. 5A and FIG. 5B are to illustrate the isostatic molding method of the third embodiment of the invention, in which the structure of the body to be compressed differs from that of the body to be compressed in the first embodiment, but the others are the same as those in the first embodiment.

Specifically, in the third embodiment of the invention, at least one partitioning plate 63 of a rigid material, such as tool steel, high-speed steel, stainless steel or the like, is provided between the upper plate 35 and the lower plate 37, and powders 65 and 67 of, for example, Mo or the like are filled into the spaces between the plates to prepare a body 61 to be compressed. In this, the body 61 is isostatically compressed in a water tank 41 to give a plurality of green compacts 69 and 71 all at a time. Varying the amount of the powder to be filled in each space in this case gives a plurality of green compacts each having a different thickness, all at a time.

In the first to third embodiments of the invention illustrated hereinabove, Mo powder was used as the starting powder. Needless-to-say, the starting powder in the invention is not limited to only Mo powder, and the invention applies to any powdery materials of, for example, ceramic powders, high-melting-point metallic powders such as W and the like for molding them, as well as to production of composites of Cu/W, Cu/Mo, W/Ni/Cu, W/Ni/Fe and the like from powdery materials, and to production of other composites of Mo/TiC, Al/SiC and the like from powdery materials.

Embodiments of the semiconductor package of the invention are described below.

In one embodiment of the semiconductor package of the invention, semiconductor chips are mounted on a heat-radiating substrate, either directly thereon or via a composite substrate of aluminum nitride as sandwiched between high heat conductivity metallic plates.

The semiconductor chips may be microwave semiconductor chips or power semiconductor chips.

The heat-radiating substrate is a Cu—Mo composite substrate having a thickness of smaller than 0.4 mm, which is prepared by impregnating from 30 to 40% by mass of copper (Cu) melt into a molybdenum green compact. The heat-radiating substrate is a high-reliability heat-radiating substrate characterized by having a thermal expansion coefficient of from 7.7 to $9.0 \times 10^{-6}$/K, a thermal conductivity of from 200 to 220 W/m·K, a Young's modulus of from 220 to 230 GPa, and a density of not larger than 9.8 g/cm$^3$.

Concretely, the heat-radiating substrate is produced according to the isostatic molding method of any of the first to third embodiments of the invention mentioned above. Briefly, for this, an Mo green compact is prepared from Mo powder, Cu is mounted on the Mo green compact and heated so as to impregnate Cu melt into the Mo green compact to give a Cu—Mo composite substrate, and thereafter the resulting Cu—Mo composite substrate is rolled to give the intended, heat-radiating substrate having a thickness of smaller than 0.4 mm.

Hereinunder described are specific examples for producing heat-radiating substrates according to the isostatic molding method of the embodiment of the invention mentioned above.

EXAMPLE 1

As in FIG. 5A and FIG. 5B, molybdenum power having a mean grain size of 4 μm was filled into a split mold (made of iron) having a width of 90 mm and a length of 170 mm, in which one partitioning wall of iron was disposed so that one split mold could produce two green compacts both at a time. The mold thus filled with the Mo powder was cased in a rubber case, and compressed through CIP (cold isostatic pressing) under a pressure of 2.0 ton/cm$^2$. The green compacts formed herein had a size of 90×170×T10, and had a relative density of about 60%.

Next, a copper plate corresponding to 38% by mass of molybdenum was put on each molybdenum green compact having been prepared previously, which was then gradually heated from 700° C. up to the highest temperature of 1300° C. in a heating furnace having a hydrogen atmosphere.

For the heat treatment, the final temperature must be a temperature at which copper could melt completely. From the data of the experiments made by the inventors, it was found that the final temperature for the heat treatment must be at 1150° C. or higher and that the temperature for uniform copper impregnation to make the composite have a predetermined copper content must not be higher than 1300° C.

The copper-impregnated composite had a size of 86×163× T9.6, and had a Cu content of from 35 to 36% by mass.

The relationship between the CIP pressure applied and the density of the green compacts produced, and that of the CIP pressure and the Cu content of the composites produced under the same copper impregnation condition (highest temperature: 1300° C.) are shown in Table 1 below.

TABLE 1

Relationship Between CIP Pressure, Density and Cu Content

| CIP Pressure (ton/cm$^2$) | 1.0 | 1.5 | 2.0 | 3.0 |
|---|---|---|---|---|
| Density of Green Compact (gr./cm$^3$) | 5.0 | 5.4 | 5.9 | 6.6 |
| Cu Content of Composite (% by mass) | 40 | 38 | 35 | 31 |

Next, minor copper having remained on the surface of each composite was removed through liquid honing, and the composite was hot-rolled, while being heated with hot plates kept at 300° C., for which the reduction ratio fell between 10 and 30%. After having been thus rolled to have a reduced thickness T of 3.3 mm, the composite was annealed for strain removal in a hydrogen atmosphere furnace at 800° C., whereby its Vickers hardness Hv of 200 was lowered to 160. Next, this was rolled at room temperature to a reduction ratio falling between 5 and 10%, thereby having a further reduced thickness T of 1.5 mm, and thereafter again annealed for strain removal in a hydrogen atmosphere furnace at 800° C. Then, this was further rolled at room temperature to a reduction ratio of not larger than 10%, thereby having a further reduced thickness T of 0.5 mm, and thereafter still again annealed for strain removal in a hydrogen atmosphere furnace at 800° C. The Vickers hardness Hv of the thus-rolled composite fell between 160 and 170. The composite was further rolled to a reduction ratio of not larger than 10%, thereby reducing its thickness T of 0.5 mm to 0.2 mm.

The rolled sheets of the composite having a thickness T of 0.8 mm were characterized by having a mean thermal expansion coefficient of 8.5×10$^{-6}$/K, a thermal conductivity of 210 W/m·K and a Young's modulus of 220 GPa. It is presumed that there will be no significant change in the thermal characteristics of the composite sheets even when the sheets are further worked to have a reduced thickness T of 0.2 mm, since the thermal characteristics are greatly influenced by the copper content of the composite.

The rolled sheet having a thickness T of 0.2 mm was cut into strips having a width of 40 mm and a length of 150 mm, which were then blanked to give pieces having a width of 10 mm and a length of 25 mm. In the composite pieces having been thus blanked out, no defects of delamination, cracking or fissuring were found at their sides, and, in addition, they had good surface condition.

The composite sheet will be soldered or blazed with Ag, when worked into heat-radiating substrates. Taking it into consideration, the composite sheet was plated with Ni or Ni—P of from 2 to 3 μm thick in an electroless plating manner, whereupon the plated sheet had no defects of blistering. This supports the applicability of the composite to heat-radiating substrates.

EXAMPLE 2

Figure 4C:
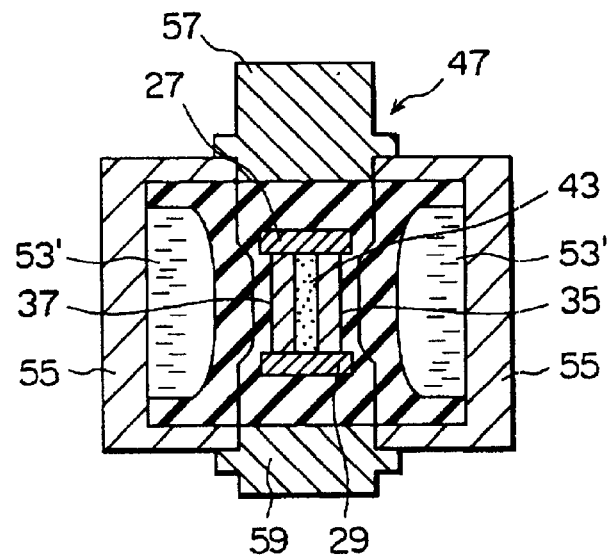
FIG. 4C is a conceptual view of an application of the body to be compressed of FIG. 4A to a dry-type isostatic molding method, which is for graphically explaining the second embodiment of the invention of an isostatic molding method.

As in FIGS. 4A to 4C, green compacts were produced through dry CIP, for which was used the same split mold as in Example 1. The body to be compressed was put in a rubber case, and subjected to dry CIP. The data of the density of the green compacts produced herein, relative to the CIP pressure applied, and those of the Cu content of the composites also produced herein, relative to the CIP pressure applied and under the same impregnation condition (highest temperature: 1300° C.), were nearly the same as those in Table 1 above.

The Cu-impregnated composites produced herein were rolled and blanked in the same manner as in Example 1 for CIP. As a result, the characteristic data of the rolled sheets and the blanked pieces obtained herein were nearly the same as those in Example 1. This means that the composites produced herein are well applicable to heat-radiating substrates for semiconductor packages (PKG).

As has been described hereinabove, the invention provides an isostatic molding method for producing inexpensive green compacts having a well-controlled shape.

The invention also provides a method for producing thin, heat-radiating substrates having good characteristics and good workability, according to the isostatic molding method.

The invention further provides microwave semiconductor packages and power semiconductor packages, in which are used thin, heat-radiating substrates as prepared according to the heat-radiating substrate production method.

While the invention has been described in detail and with reference to specific embodiments thereof, it will be apparent to one skilled in the art that various changes and modifications can be made therein without departing from the spirit and scope thereof.

What is claimed is:

1. A semiconductor package to be mounted with semiconductor chips, said semiconductor package comprising a heat-radiating substrate which has a thickness of smaller than 0.4 mm of a Cu—Mo composite which is obtained by a process of forming a green compact of molybdenum by carrying out compression and by impregnating 30 to 40% by mass of copper (Cu) melt into the green compact of molybdenum, the process containing no sintering step, said Cu—Mo composite having a plasticity workability superior to either of a Cu—Mo sintered compact body or a Cu-impregnated Mo sintered body.

2. The semiconductor package as claimed in claim 1, wherein the semiconductor chips are microwave semiconductor chips.

3. The semiconductor package as claimed in claim 1, wherein said green compact is made by carrying out compression through cold isostatic pressing.

4. A semiconductor package as claimed in claim 1, wherein said heat-radiating substance is a high-reliability heat-radiating substrate and has a thermal expansion coefficient of from 7.7 to 9.0×10$^{-6}$/K, a thermal conductivity of from 200 to 220 W/m·K, a Young's modulus of from 220 to 230 GPa, and a density of not larger than 9.8 g/cm$^3$.

5. The semiconductor package as claimed in claim 4, wherein the semiconductor chips are microwave semiconductor chips.

6. A power semiconductor package with semiconductor chips being mounted on a composite substrate of aluminum nitride as sandwiched between heat-radiating substrates of high heat conductivity metal plates, at least one of said heat-radiating substrates being of substantially a Cu—Mo composite as prepared by impregnating copper melt into a green compact of Mo powder having been previously mixed with at most 5% by mass of Cu, in such a manner that the total Cu content of the thus-impregnated green compact may fall between 40 and 60% by mass.

* * * * *